(12) United States Patent
Cho et al.

(10) Patent No.: US 7,547,943 B2
(45) Date of Patent: Jun. 16, 2009

(54) NON-VOLATILE MEMORY DEVICES THAT INCLUDE A SELECTION TRANSISTOR HAVING A RECESSED CHANNEL AND METHODS OF FABRICATING THE SAME

(75) Inventors: Myoung-Kwan Cho, Gyeonggi-do (KR); Eun-Suk Cho, Gyeonggi-do (KR); Wook-Hyun Kwon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 318 days.

(21) Appl. No.: 11/022,181

(22) Filed: Dec. 22, 2004

(65) Prior Publication Data

US 2006/0023558 A1 Feb. 2, 2006

(30) Foreign Application Priority Data

May 4, 2004 (KR) ...................... 10-2004-0031469

(51) Int. Cl.
*H01L 29/94* (2006.01)
(52) U.S. Cl. ...................... 257/326; 257/315; 257/316; 257/296; 257/E29.129; 257/E27.103; 365/185.01; 365/185.07; 365/185.11

(58) Field of Classification Search ................. 257/326; 365/185.17
See application file for complete search history.

(56) References Cited

U.S. PATENT DOCUMENTS

| 4,964,080 A | 10/1990 | Tzeng ........................ 365/185 |
| 5,677,556 A * | 10/1997 | Endoh ........................ 257/316 |
| 2005/0082600 A1 * | 4/2005 | Hsu et al. .................... 257/317 |
| 2005/0265076 A1 * | 12/2005 | Forbes .................... 365/185.17 |

FOREIGN PATENT DOCUMENTS

| JP | 61-088059 | | 10/1987 |
| JP | 03023674 A | * | 1/1991 |
| JP | 02-193154 | | 3/1992 |
| KR | 10-2003-7000786 | | 2/2003 |

* cited by examiner

*Primary Examiner*—Kenneth A Parker
*Assistant Examiner*—Jose R Diaz
(74) *Attorney, Agent, or Firm*—Myers Bigel Sibley & Sajovec

(57) ABSTRACT

A NAND-type non-volatile memory device includes a substrate and a device isolation layer disposed on the substrate to define an active region. First and second selection transistors are disposed in the active region, such that each of the first and second selection transistors has a recessed channel. A plurality of memory transistors is disposed in the active region between the first selection transistor and the second selection transistor.

10 Claims, 22 Drawing Sheets

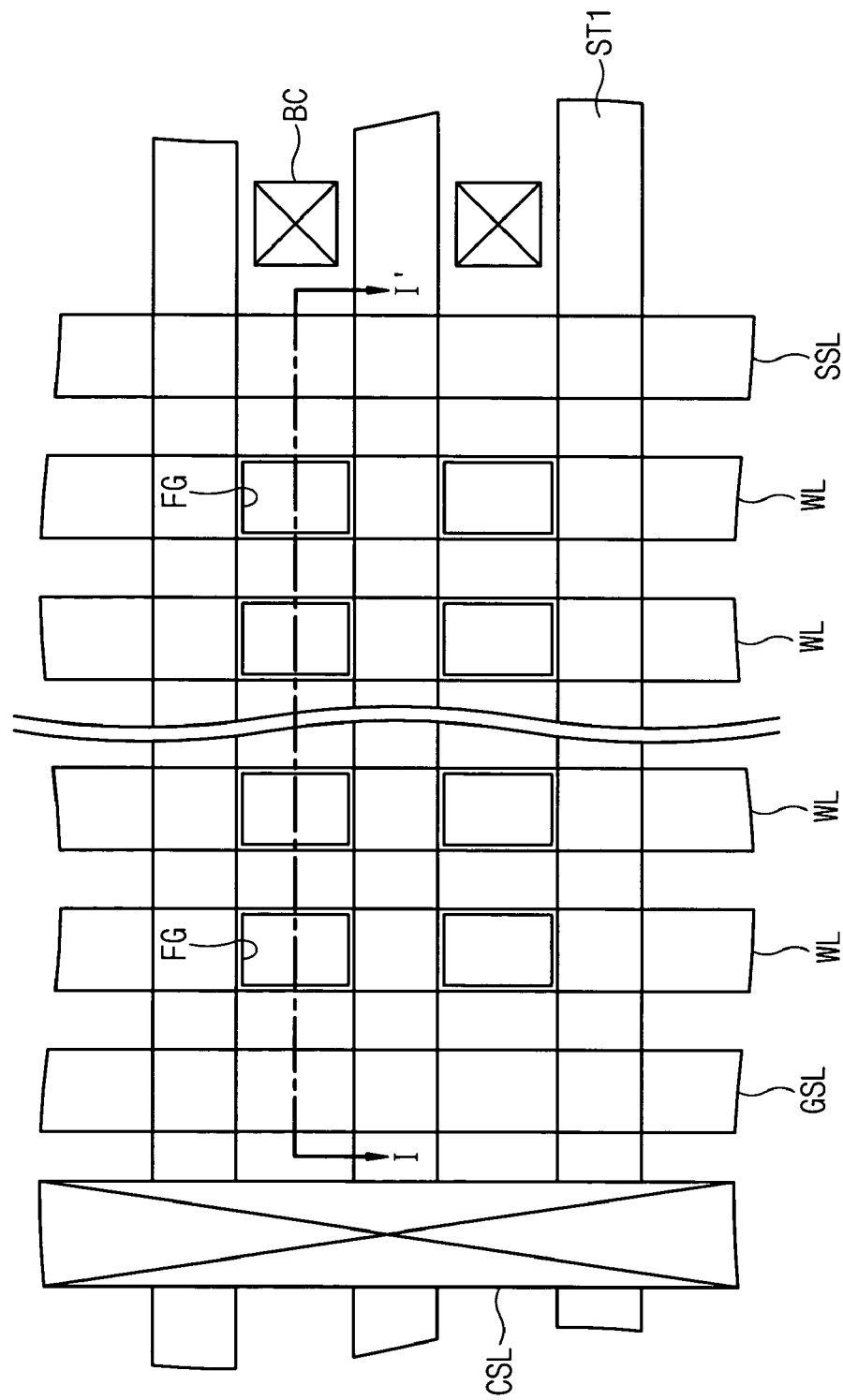

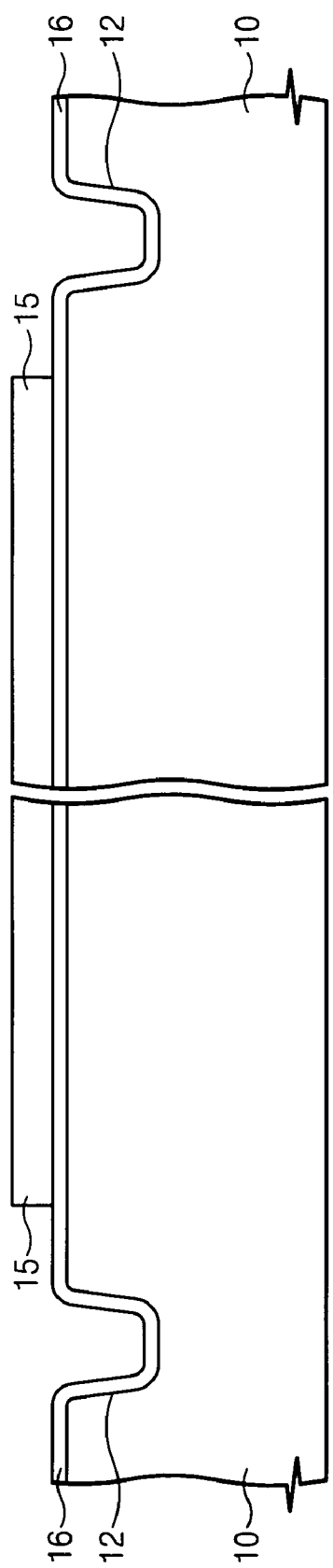

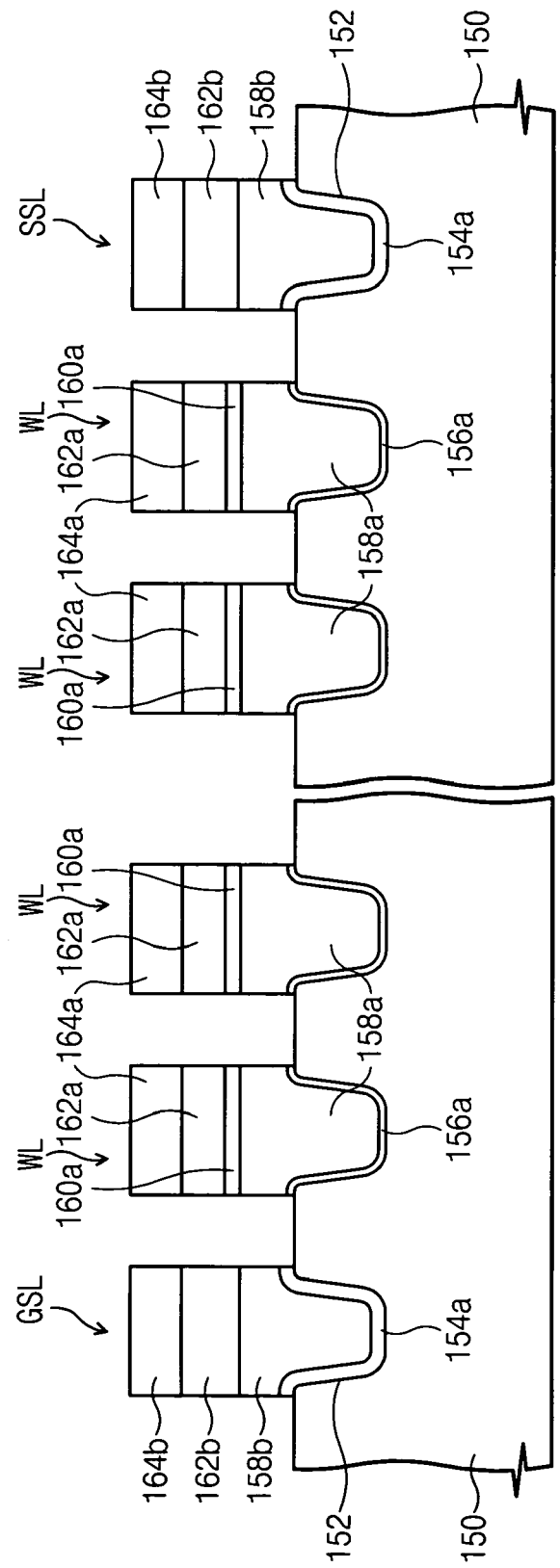

US 7,547,943 B2

NON-VOLATILE MEMORY DEVICES THAT INCLUDE A SELECTION TRANSISTOR HAVING A RECESSED CHANNEL AND METHODS OF FABRICATING THE SAME

RELATED APPLICATION

This application claims the benefit of and priority to Korean Patent Application No. 2004-31469 filed May 4, 2004, the disclosure of which is hereby incorporated herein by reference.

FIELD OF THE INVENTION

The present invention relates generally to integrated circuit devices and methods of fabricating the same and, more particularly, to non-volatile memory devices and methods of fabricating the same.

BACKGROUND OF THE INVENTION

Selection transistors of non-volatile memory devices are connected to a memory transistor and perform a function to provide access to the memory transistor. As shown in FIG. 1, NAND-type flash memory devices are typical non-volatile memory devices having selection transistors that have a cell string structure made up of a couple of selection transistors and memory transistors between the selection transistors. The selection transistors may be classified into a ground selection transistor and a string selection transistor. A NAND-type cell array may comprise a plurality of cell strings and may include a ground selection line GSL, a string selection line SSL, and a word line WL crossing the cell strings. A gate electrode of a memory transistor is connected to the word line WL, and a ground selection transistor and the string selection transistor are respectively connected to the ground selection line GSL and the string selection line SSL.

FIGS. 2A and 2B respectively show a channel voltage of a memory cell transistor of a selected cell string and a non-selected cell string in a write operation. Referring to FIGS. 2A and 2B, 0 volts are applied to the ground selection line GSL, 0 volts are applied to the string selection line SSL and the selected bit line, and Vcc is applied to the non-selected bit line. In addition, a high program voltage (e.g. approximately 18 volts) is applied to the selected word line, and a pass voltage Vpass capable of turning on a memory transistor is applied to the non-selected word line. The memory transistor is selected by the selected word line and the non-selected word line. As shown in FIG. 2A, in the selected memory transistor, a program voltage (e.g., approximately 18 volts) is applied to a gate electrode, and 0 volts are applied to a channel to be programmed by F-N tunneling. A channel is floating in the memory cell transistor of the non-selected cell string connected to the selected word line so that even though a program voltage is applied to the gate electrode, the channel voltage is boosted about 8 volts so as to inhibit programming.

However, when the selected memory transistor is programmed, there is a possibility that the non-selected memory transistor sharing the selected word line is programmed. This abnormal program may be caused by a memory transistor connected to the selected word line. As previously mentioned, to prevent the selected memory transistor form being programmed, it is necessary for the channel voltage to be boosted to suppress the program irrespective of the application of the program voltage to the gate electrode. However, if the channel voltage is not boosted, then an abnormal program may occur. As shown in FIGS. 3A and 3B, when 18 volts and 0 volts are respectively applied to the gate electrode and the channel of the selected memory transistor to be programmed, the channel voltage of the non-selected memory transistor frequently remains around 0 volts. In other words, the channel of the non-selected memory transistor is not floating by forming a current path under any circumstance.

A cell string of the NAND-type cell array is floated by a selection transistor. Accordingly, if there is a channel leakage in the selection transistor, this function may be performed abnormally. The above abnormal program may become more serious with decreasing channel length of the transistor. After considering all the factors, leakage current is generated by punch-through with decreasing channel length of the selection transistor. As a result, the channel of the non-selected cell string may not float, which may impair voltage boosting.

SUMMARY OF THE INVENTION

According to some embodiments of the present invention, a NAND-type non-volatile memory device includes a substrate and a device isolation layer disposed on the substrate to define an active region. First and second selection transistors are disposed in the active region, such that each of the first and second selection transistors has a recessed channel. A plurality of memory transistors is disposed in the active region between the first selection transistor and the second selection transistor.

In other embodiments of the present invention, each one of the plurality of memory transistors comprises a tunnel insulating layer, a floating gate, a gate interlayer insulating layer, and a control gate electrode, which are sequentially stacked on the active region.

In still other embodiments of the present invention, each one of the plurality of memory transistors comprises a charge storage insulating layer and a gate electrode, which are stacked on the active region.

In still other embodiments of the present invention, each of the first and second selection transistors comprises a source and a drain having a junction depth and the respective recessed channels of the first and second selection transistors are more deeply recessed than the junction depth.

In still other embodiments of the present invention, each of the plurality of memory transistors has a recessed channel.

In still other embodiments of the present invention, each of the recessed channels of the plurality of memory transistors has a depth that is greater than a width thereof.

In further embodiments of the present invention, a non-volatile memory device includes a substrate and a device isolation layer disposed on the substrate to define a plurality of parallel active regions. First and second selection gate patterns cross over the active regions. A plurality of memory gate patterns are disposed between the first and second selection gate patterns that cross over the active regions. A plurality of charge storage layers is disposed between the plurality memory gate patterns and the active regions, respectively. A conductive diffusion layer is disposed on the substrate at both sides of the first and second selection gate patterns and the plurality of memory gate patterns to define respective channel regions under the first and second selection gate patterns and the plurality of memory gate patterns. The respective channel regions under the first and second selection gate patterns are more deeply recessed than a junction depth of the conductive diffusion layer.

In still further embodiments of the present invention, the respective channel regions under the plurality of memory gate patterns are more deeply recessed than the junction depth of the conductive diffusion layer.

In still further embodiments of the present invention, each of the respective channels regions has a recess depth that is greater than a width thereof.

In other embodiments of the present invention, a non-volatile memory device includes a substrate and a device isolation layer disposed on the substrate to define a plurality of parallel active regions. First and second selection gate patterns cross over the active regions. A plurality of memory gate patterns is disposed between the first and second selection gate patterns that cross over the active regions. A plurality of floating gates is disposed between the plurality of memory gate patterns and the active regions, respectively. A conductive diffusion layer is disposed on the substrate at both sidewalls of the first and second selection gate patterns and the plurality of memory gate patterns to define respective channel regions under the first and second selection gate patterns and the memory gate patterns. The respective channel regions under the first and second selection gate patterns are more deeply recessed than a junction depth of the conductive diffusion layer.

In still other embodiments of the present invention, each of the respective channels regions has a recess depth that is greater than a width thereof.

In still other embodiments of the present invention, the respective channel regions under the plurality of memory gate patterns are more deeply recessed than the junction depth of the conductive diffusion layer.

In still other embodiments of the present invention, each of the respective channels regions has a recess depth that is greater than a width thereof.

In further embodiments of the present invention, a nonvolatile memory device is fabricated by forming a device isolation layer on a substrate to define an active region. A part of the active region is etched to form isolated recess regions at spaced apart intervals. A ground selection gate pattern and a string selection gate pattern are formed on respective recess regions. A plurality of memory gate patterns is formed between the ground selection gate pattern and the string selection gate pattern. Impurities are implanted in the active region at both sides of the ground selection gate pattern, the string selection gate pattern, and the plurality of memory gate patterns, respectively, to form conductive diffusion layers.

In still further embodiments of the present invention, a plurality of charge storage layers is formed between the plurality of memory gate patterns and the active region, respectively.

In still further embodiments of the present invention, each of the recess regions has a depth that is greater than a width thereof.

In still further embodiments of the present invention, a plurality of floating gates is formed between the plurality of memory gate patterns and the active region, respectively.

In other embodiments of the present invention, a nonvolatile memory device is fabricated by forming a device isolation layer on a substrate to define an active region. A plurality of isolated recess regions is formed at spaced apart intervals on the active region. A ground selection gate pattern and a string selection gate pattern are formed on respective recess regions. A plurality of memory gate patterns is formed between the ground selection gate pattern and the string selection gate pattern. Impurities are implanted between the ground selection gate pattern and the string selection gate pattern, and the memory gate patterns to form a conductive diffusion layer.

In still other embodiments of the present invention, a plurality of charge storage layers is formed between the plurality of memory gate patterns and the active region, respectively.

In still other embodiments of the present invention, a plurality of floating gate patterns is formed between the plurality of memory gate patterns and the active region, respectively.

In still other embodiments of the present invention, each of the recess regions has a depth that is greater than a width thereof.

BRIEF DESCRIPTION OF THE DRAWINGS

Other features of the present invention will be more readily understood from the following detailed description of specific embodiments thereof when read in conjunction with the accompanying drawings, in which:

FIG. 4 is a plan view that illustrates a NAND-type cell array in accordance with some embodiments of the present invention;

FIGS. 5B through 5E are cross-section views that illustrate methods of fabricating NAND-type flash memory devices according to some embodiments of the present invention;

FIGS. 8B through 8D are cross-section views that illustrate methods of fabricating the NAND-type flash memory device according to the embodiments of the present invention illustrated in FIG. 8A.

DETAILED DESCRIPTION OF PREFERRED EMBODIMENTS

Figure 1:
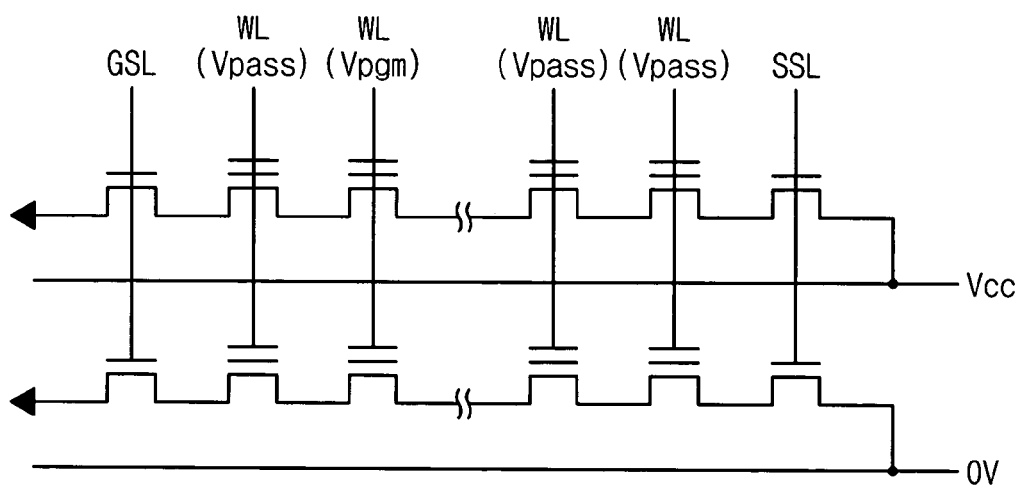
FIG. 1 is a circuit diagram of a conventional NAND-type flash memory device.
Figure 2A:
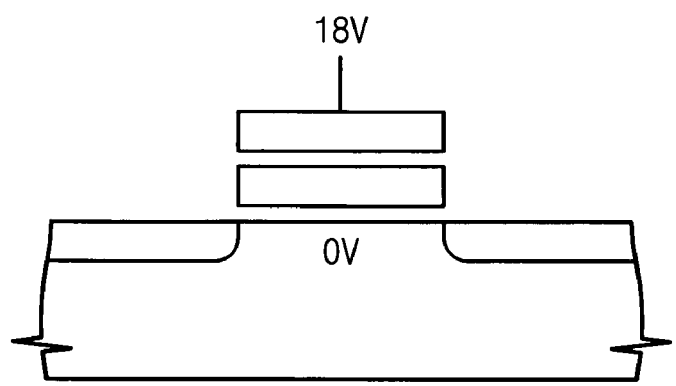
FIGS. 2A and 2B respectively show a channel voltage of a memory cell transistor of a selected cell string and a non-selected cell string in a write operation in a conventional NAND-type flash memory device.
Figure 2B:
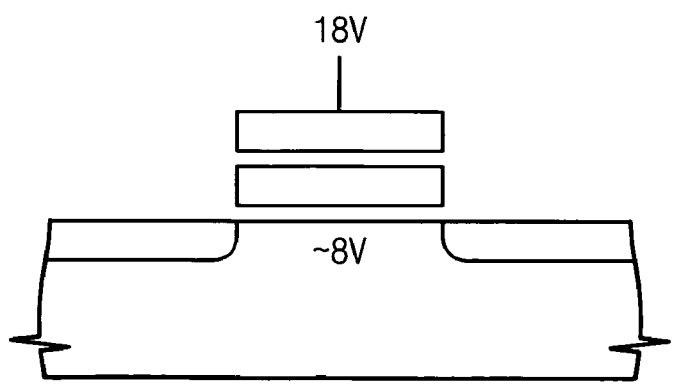
Figure 3A:
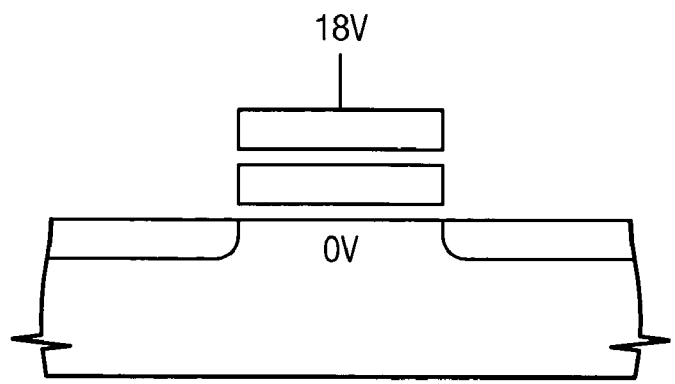
FIGS. 3A and 3B illustrate an abnormal program operation of a conventional NAND-type flash memory device.
Figure 3B:
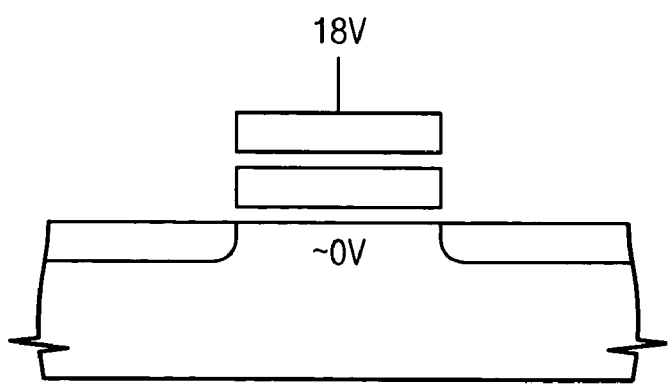

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 4 is a plan view that illustrates a NAND-type cell array in accordance with some embodiments of the present invention. Referring to FIG. 4, the NAND-type cell array comprises a device isolation layer formed on a substrate to define a plurality of parallel active regions and a plurality of gate lines crossing over the active region to be placed in parallel. The gate lines comprise a ground selection line GSL, a string selection line SSL, and word lines WL between the ground selection line GSL and the string selection line SSL. The word line WL includes a floating gate FG on the active region. A bit line contact BC is formed on the active region neighboring the string selection line SSL, and a common source line CSL neighboring the ground selection line GSL crosses over the active regions. The common source line CSL is electrically connected to the active regions.

Figure 5A:
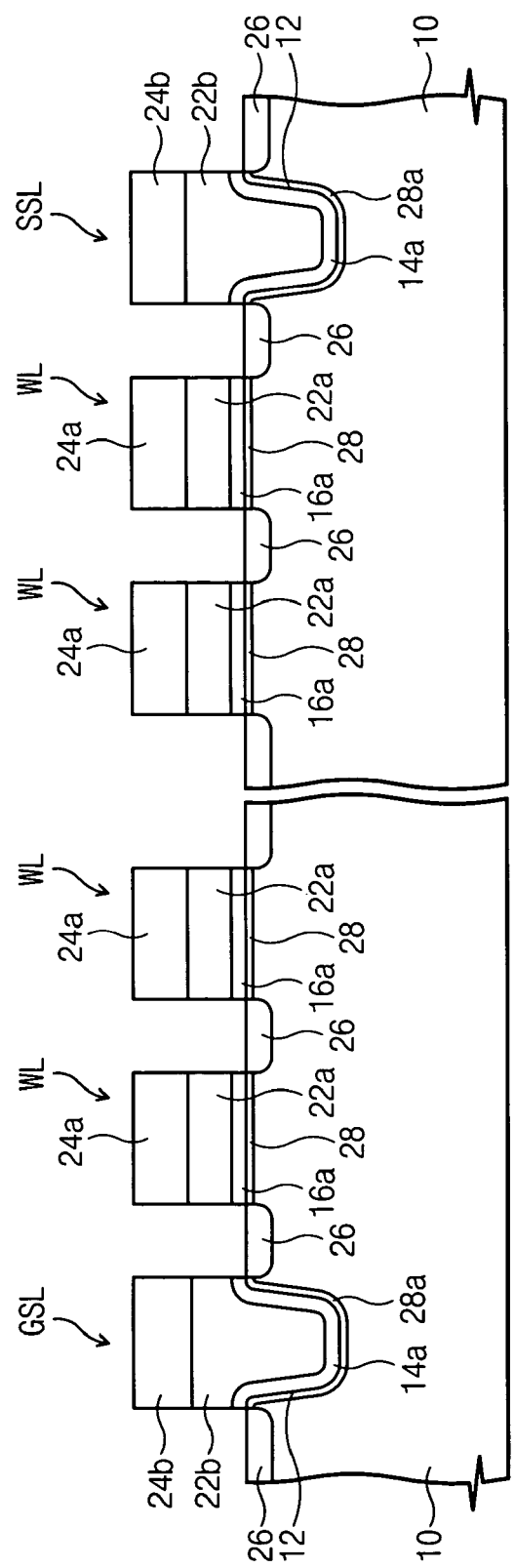
FIG. 5A is a cross-section view of a NAND-type flash memory device according to some embodiments of the present invention taken along line I-I' of FIG. 4.

FIG. 5A is a cross-section view of a NAND-type flash memory device according to some embodiments of the present invention taken along line I-I' of FIG. 4. The present invention may be applicable to a floating-trap-type flash memory device. Referring to FIG. 5A, a couple of a selection patterns are arranged so as to cross over a plurality of active regions defined by a device isolation layer to be selection gate lines GSL and SSL. A plurality of memory gate patterns comprising the word line WL between the selection gate patterns are placed in parallel each other.

A conductive diffusion layer 26 implanted by impurities is formed in an active region at both sides of the ground selection gate pattern and the string selection gate pattern, and the memory gate patterns. The ground selection gate pattern and the string selection gate pattern, and the memory gate patterns are made up of lower gate patterns 22a and 22b, and upper gate patterns 24a and 24b, respectively. The lower gate patterns 22a and 22b generally comprise a silicon layer, and the upper gate pattern 24a and 24b may comprise a high conductive layer, such as metal, metal silicide and the like. The upper most layer of the upper gate patterns 24a and 24b may comprise a silicon nitride layer, a silicon oxide layer, and/or an insulating layer such as a silicon acid nitride layer.

A charge storage insulating layer 16a is disposed between the memory gate pattern and the active region. The charge storage insulating layer 16a may comprise a tunnel insulating layer, a charge trap layer, and a blocking insulating layer, which are sequentially stacked. In other words, the charge storage insulating layer 16a may comprise a silicon oxide layer, a silicon nitride layer and a stacked layer of a silicon oxide layer, or a silicon oxide layer, a silicon nitride layer and a stacked layer of an aluminum oxide layer, or a silicon oxide layer, a hafnium layer, a silicon nitride layer and a stacked layer of an aluminum oxide layer in accordance with various embodiments of the present invention.

An active region under the selection gate pattern is recessed. Accordingly, a lower portion of the selection gate pattern is curved along the shape of the substrate. A gate insulating layer 14a is formed between the selection gate pattern and the active region.

Channel regions 28 and 28a are defined on a substrate between the conductive diffusion layer 26. The channel region 28a under the selection gate pattern is curved along the shape of the active region. The recessed region 12 is formed deeper than the junction depth of the conductive diffusion layer 26 so that the channel region 28a under the selection gate pattern may have a structure that is curved lower than the conductive diffusion layer 26. Therefore, it is possible to maintain or increase the channel length of the selection transistor by increasing the recess depth of the selection gate pattern irrespective of scaling down the width of the selection gate pattern.

Figure 5B:
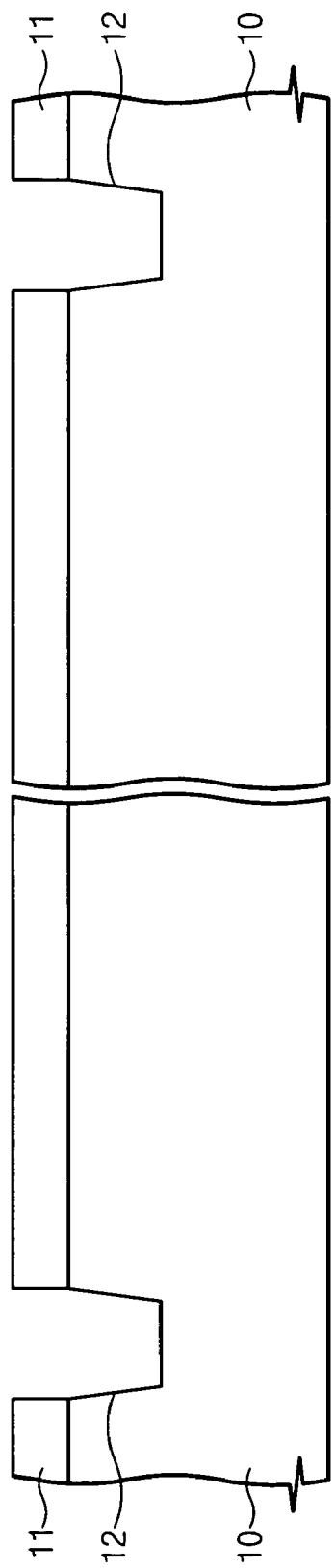

FIGS. 5B through 5E are cross-section views that illustrate methods of fabricating NAND-type flash memory devices according to some embodiments of the present invention. Referring to FIG. 5B, a device isolation layer is formed on a semiconductor substrate to define a plurality of parallel active regions as shown in FIG. 4. A hard mask layer is formed and patterned on an entire surface of the substrate to form a hard mask pattern 11 having an opening for exposing a part of the substrate. The opening is formed so as to correspond to a position where a selection gate pattern will be formed and to cross over the active region. The substrate of the active region is etched using the hard mask pattern 11 as an etching mask to form a recess region 12. As a result, a couple of recess regions 12 are formed on the active region at predetermined intervals.

Referring to FIG. 5C, after removing the hard mask pattern 11, a charge storage insulating layer 16, where a tunnel insulating layer, a charge trap layer, and a blocking insulating layer are stacked, is formed on an entire surface of the substrate. Before and/or after forming the charge storage layer, an impurity implantation process for controlling a threshold voltage may be performed. The charge storage layer 16 may comprise a silicon oxide layer, a silicon nitride layer, and a stacked layer of a silicon oxide layer, or a silicon oxide layer, a silicon nitride layer, and a stacked layer of an aluminum oxide layer, or a silicon oxide layer, a hafnium layer, a silicon nitride layer, and a stacked layer of an aluminum oxide layer in accordance with various embodiments of the present invention.

After removing the hard mask pattern 11, a process for forming a sacrificial oxide layer for curing etching damages and then removing the sacrificial oxide layer and cleaning may optionally be performed in accordance with some embodiments of the present invention. As a result, as shown in FIG. 5C, the edge of the recess region may be rounded.

A mask pattern 15 covering an upper portion of a region is formed on the substrate on which the charge storage insulating layer 16 is formed. In this case, the memory transistor is formed on the region. The mask pattern 15 covers an upper portion of the region where the memory transistor is formed and exposes a region where the selection gate is formed.

Figure 5D:
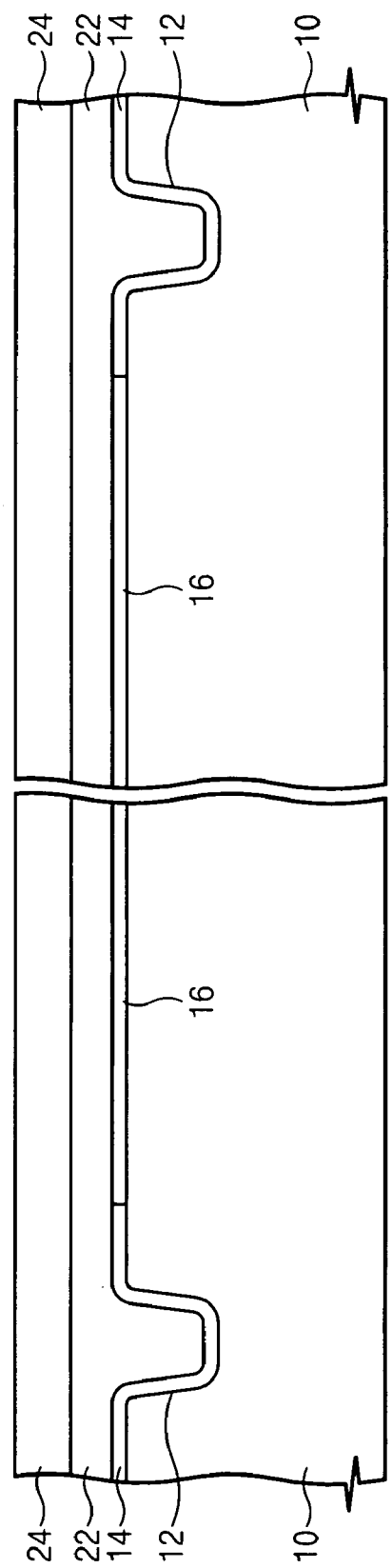

Referring to FIG. 5D, a charge storage insulating layer 16 is removed using the mask pattern 15 as an etching mask. The charge storage insulating layer 16 on the recess region 12 and the active region neighboring the recess region 12 is removed so that the substrate is exposed. After removing the mask pattern 15, a gate insulating layer 14 is formed in the exposed substrate. While the gate insulating layer 14 is formed, an insulating layer may be formed on the upper most layer of the charge storage insulating layer 16. A lower conductive layer 22 and an upper conductive layer 24 are formed in an entire surface of the substrate. An insulating layer as a capping layer may be further formed on the upper conductive layer 24.

Figure 5E:
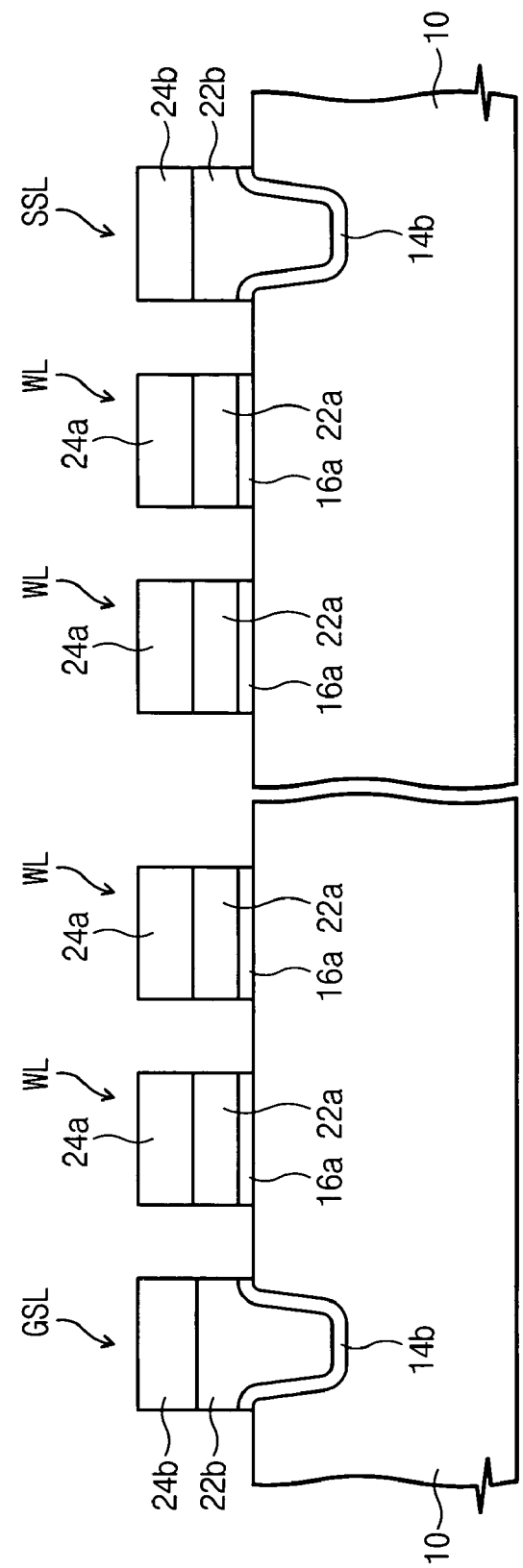

Referring to FIG. 5E, the upper conductive layer 24 and the lower conductive layer 22 are patterned to a ground selection gate pattern and a string selection gate pattern, which comprises the ground selection line GSL and the string selection line SSL, and a plurality of memory gate patterns comprising the word line WL. The ground selection gate pattern and the string selection gate pattern are respectively placed on an upper portion the recess region 12, which has a lower portion that extends and curves into a lower portion of the substrate. The ground selection gate pattern, the string selection gate pattern, charge storage insulating layer and the gate insulating layer 14 may be removed as needed.

Impurities may be continuously implanted on the substrate using the memory gate patterns, the ground selection gate pattern and the string selection gate pattern as an ion implantation mask to form a conductive diffusion layer 26 shown in FIG. 5A. The junction of the conductive diffusion layer 26 may be located higher than the lowest most portion of the recess region 12. As a result, channel regions 28 and 28a are defined on the substrate under the memory gate pattern and the selection gate pattern, i.e., the substrate between the conductive diffusion layers 26. However, the channel region 28a under the selection gate pattern bends along a surface curve of the recess region 12 and may have a structure recessed lower than the junction depth of the neighboring conductive diffusion layer. The recess region 12 may be formed deeper than the width of the recess region to increase the channel length of the transistor in a limited area.

As discussed above, embodiments of the present invention may be applicable to the floating-trap-type flash memory having a charge storage insulating layer as well as the floating-gate-type flash memory having a floating gate.

Figure 6A:
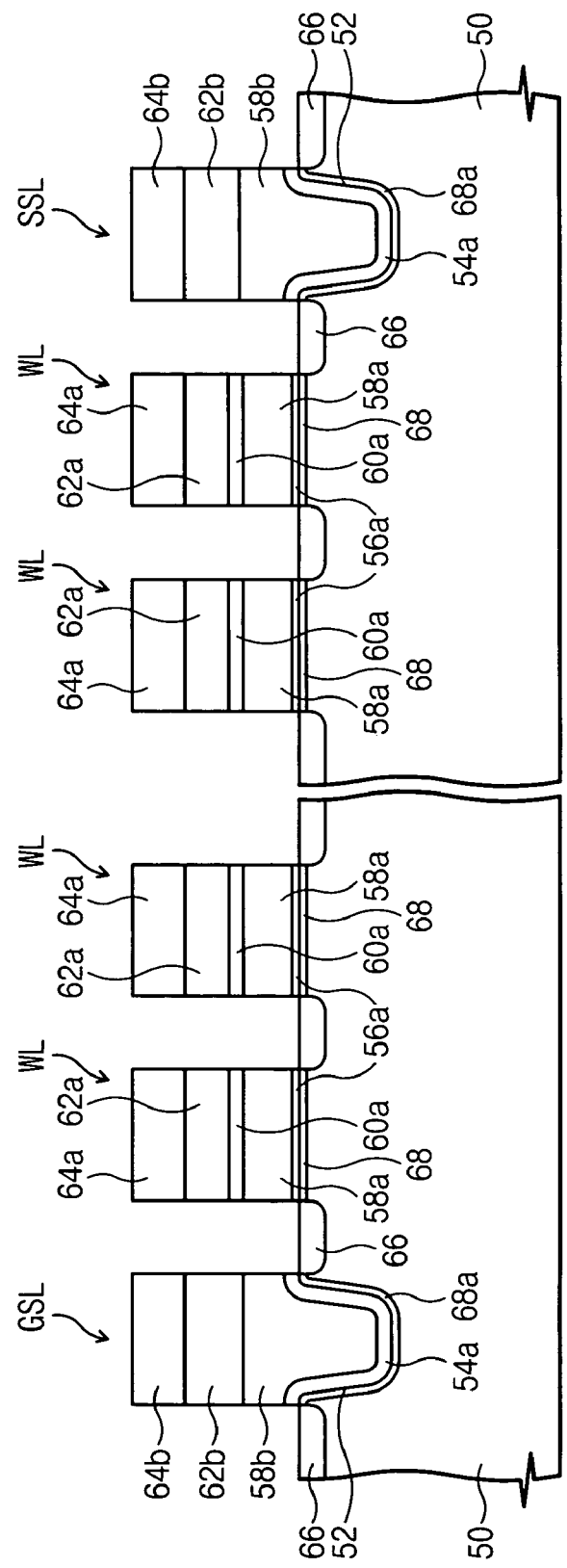
FIG. 6A is a cross-sectional view of a NAND-type flash memory device taken along line I-I' of FIG. 4 according to further embodiments of the present invention.

FIG. 6A is a cross-sectional view of a NAND-type flash memory device taken along line I-I' of FIG. 4 according to further embodiments of the present invention. Referring to FIG. 6A, a ground selection gate pattern and a string selection gate pattern crossing over a plurality of active regions defined by a device isolation layer comprised of a ground selection line GSL and a string selection line SSL are formed. Memory gate patterns comprising word lines WL are arranged between the ground selection gate pattern and the string selection gate pattern.

A conductive diffusion layer 66 implanted with impurities is formed in the ground selection gate pattern, the string selection gate pattern, and active regions at both sides of the memory gate patterns. The memory gate patterns respectively comprise a middle gate pattern 62a and an upper gate pattern 64a, and the selection gate patterns respectively comprise a lower gate pattern 58b, a middle gate pattern 62b, and an upper gate pattern 64b. The lower gate pattern 58b and the middle gate patterns 62a and 62b may comprise a silicon layer, and the upper gate patterns 64a and 64b may comprise a high conductive layer such as metal, metal silicide, and the like. The upper most layer of the gate patterns 64a and 64b may comprise an insulating layer, such as a silicon oxide layer, a silicon nitride layer, and/or a silicon acid nitride layer.

A floating gate 58a is disposed between the memory gate pattern and the active region. An interlayer dielectric layer 60a is disposed between the memory gate pattern and the floating gate 58a. A tunnel insulating layer 68a is disposed between the floating gate 58a and the active region. A gate insulating pattern 54a is disposed between the selection gate pattern and the active region. The active region under the selection gate pattern is recessed. Accordingly, a lower portion of the selection gate pattern is curved along the shape of the substrate.

Channel regions 68 and 68a are defined on the substrate between the conductive diffusion layers 66. The channel region 68a under the selection gate pattern is curved along the shape of the active region. The recessed region 52 is deeper than the junction depth of the conductive diffusion layer 66 so that the channel region 58a under the selection gate pattern may have a structure with less bend than the conductive diffusion layer 66. Accordingly, it is possible to maintain or increase the channel length of the selection transistor by increasing the recess depth irrespective of scaling down the width of the selection gate pattern.

Figure 6B:
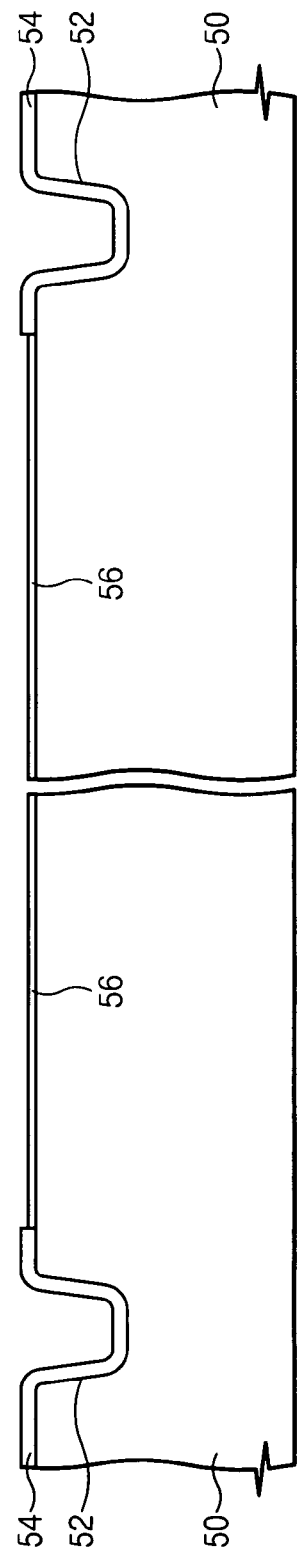
FIGS. 6B through 6D are cross-section views that illustrate methods of fabricating NAND-type flash memory devices according to further embodiments of the present invention.
Figure 6C:
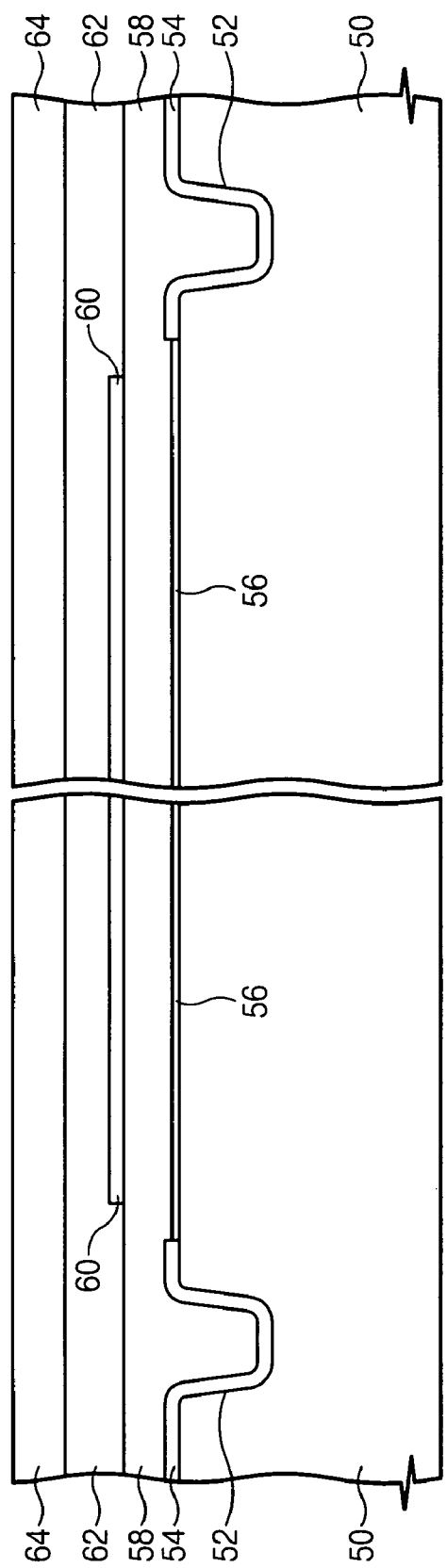
Figure 6D:
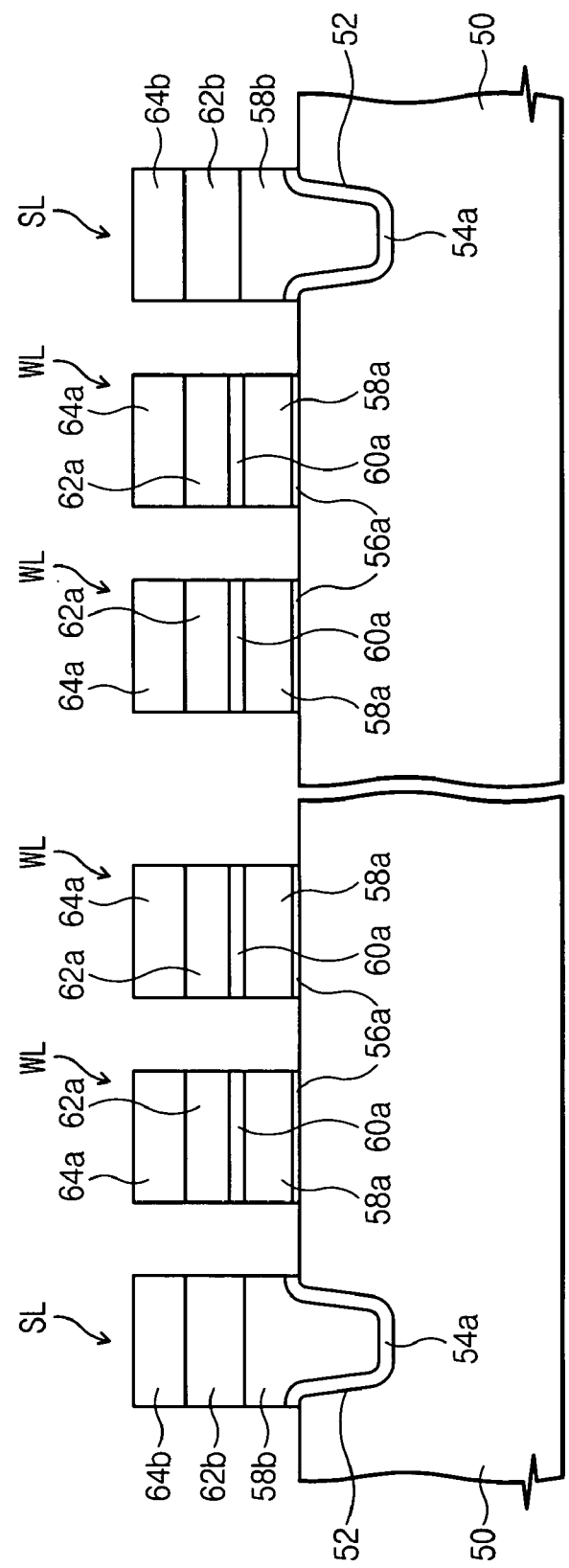

FIGS. 6B through 6D are cross-section views that illustrate methods of fabricating NAND-type flash memory devices according to further embodiments of the present invention.

Referring to FIG. 6B, a device isolation layer is formed on a semiconductor substrate to define a plurality of parallel active regions shown in FIG. 4. A hard mask pattern having an opening that exposes a part of the substrate is formed, and then the substrate is etched using the hard mask pattern as an etching mask to form a recess region 52 on the active region at predetermined intervals. After removing the hard mask pattern, a gate insulating layer 54 is formed on an entire surface of the substrate. Before/after forming the gate insulating layer, an impurity implantation process for controlling a threshold voltage is performed. The substrate around the recess region 52 is covered, and then regions where memory gate patterns are formed are exposed by removing the gate insulating layer 54. A tunnel insulating layer 56 is formed in a region where the gate insulating layer 54 is removed. As shown in FIG. 6, the tunnel insulating layer 56 is formed in a region where memory gate patterns are formed, and a resultant recessed region where the gate insulating layer 54 is formed may be obtained on the active region at both sides of the tunnel insulating layer 56.

Referring to FIG. 6C, a lower conductive layer 58 is formed on an entire surface of the substrate. A gate interlayer dielectric layer 60 is formed on the lower conductive layer 58, and the gate interlayer dielectric layer 60 is patterned to remove a gate interlayer dielectric layer 60 over the recess region 52. A middle conductive layer 62 and an upper conductive layer 64 are formed. An insulating layer as a capping layer may be further formed on the upper conductive layer 64.

Referring to FIG. 6D, the upper conductive layer 64, the middle conductive layer 62, the gate interlayer dielectric layer 60, and the lower conductive layer 58 are patterned to form a ground selection gate pattern and a string selection gate pattern crossing over the active regions, and to form a plurality of memory gate patterns arranged between the ground selection gate pattern and the string selection gate pattern. The ground selection gate pattern and the string selection gate pattern are respectively placed on an upper portion 52 of the recess region 52 and have a curved lower portion towards a lower portion of the substrate. A tunnel insulating layer and a gate insulating layer at both sides of the ground selection pattern, the string selection gate pattern and the memory gate patterns and a gate insulating layer are removed to form a tunnel insulating pattern 56a and a gate insulating pattern 54a.

Impurities may be implanted into the substrate using the memory gate patterns, the ground selection gate pattern, and the string selection gate pattern as an ion implantation mask to form the conductive diffusion layer 66 shown in FIG. 6A. The junction depth of the conductive diffusion layer 66 may be less deep than the lower most surface of the recess region 52. As a result, channel regions 58 and 58a are defined on the substrate under the memory gate pattern and the selection gate pattern, that is, the substrate between the conductive diffusion layers 66. The channel region 58a under the selection gate pattern bends along a surface curve of the recess region 52 so as to have a structure that is recessed lower than the junction depth of neighboring conductive diffusion layer. The recess region may have a depth greater than the width of the recess region to increase the channel length of the transistor in a limited area. Thus, according to some embodiments of the present invention, a memory transistor may be formed to have a recessed channel.

Figure 7A:
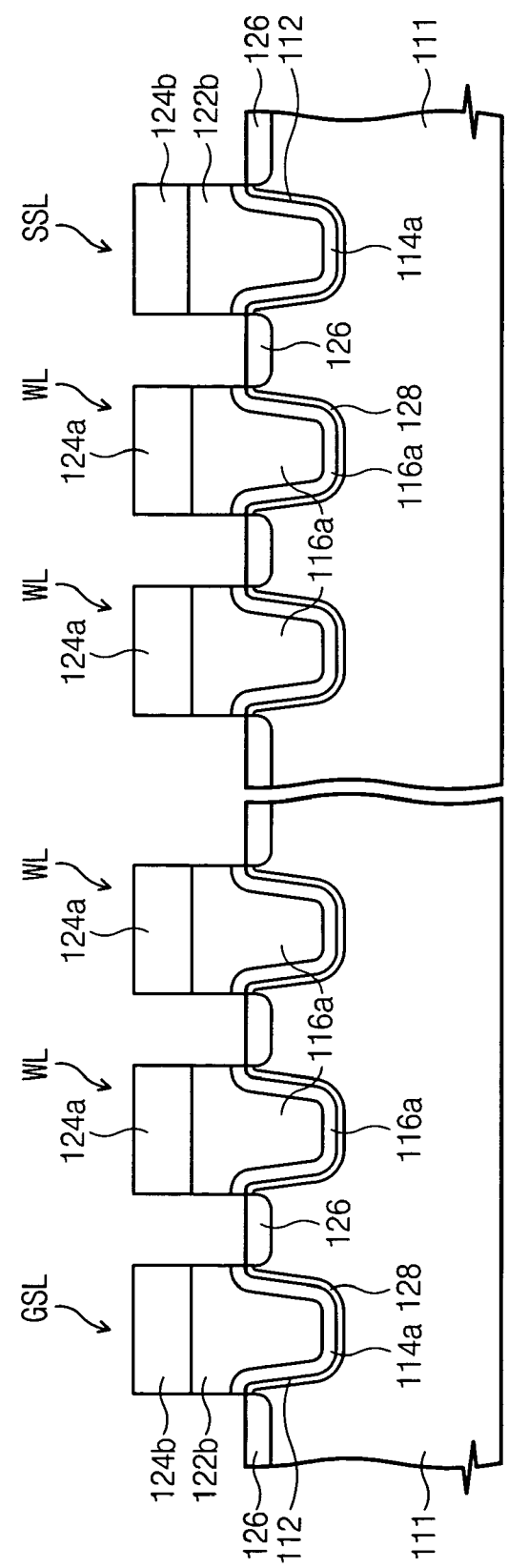
FIG. 7A is a cross-sectional view of a NAND-type flash memory device according to further embodiments of the present invention taken along line I-I' of FIG. 4.

FIG. 7A is a cross-sectional view of a NAND-type flash memory device according to further embodiments of the present invention taken along line I-I' of FIG. 4. Referring to FIG. 7A, a ground selection gate pattern and a string selection gate pattern are formed that cross over a plurality of active regions defined by a device isolation layer comprised of a ground selection line GSL and a string selection line SSL. Memory gate patterns comprising word lines WL are arranged in parallel with each other between the ground selection gate pattern and the string selection gate pattern.

A conductive diffusion layer 126 implanted with impurities is formed in the ground selection gate pattern, the string selection gate pattern, and active regions at both sides of the memory gate patterns. The ground selection gate pattern, the string selection gate pattern, and the memory gate patterns are constructed with lower gate patterns 122a and 122b and upper gate patterns 124a and 124b. The lower gate patterns 124a and 124b generally comprise a silicon layer, and the upper gate patterns 124a and 124b comprise a high conductive layer such as metal, metal silicide, and the like. The upper most layer of the upper gate patterns 124a and 124b may comprise a silicon oxide layer, a silicon nitride layer, and/or a silicon acid nitride layer.

A charge storage layer 116a is disposed between the memory gate pattern and the active region. The charge storage layer 116a may comprise a sequential stacked structure comprising a tunnel insulating layer, a charge trap layer, and a blocking insulating layer. In other words, the charge storage insulating layer 116a may comprise a silicon oxide layer, a silicon nitride layer, and a stacked layer of a silicon oxide layer, or a silicon oxide layer, a silicon nitride layer and a stacked layer of an aluminum oxide layer, or a silicon oxide layer, a hafnium layer, a silicon nitride layer and a stacked layer of an aluminum oxide layer in accordance with various embodiments of the present invention.

The ground selection gate pattern, the string selection gate pattern, and the active region under the memory gate pattern are recessed. Accordingly, lower portions of the ground selection gate pattern, the string selection gate pattern, and the memory gate pattern are curved along the shape of the substrate. A gate insulating layer 114a is formed between the ground selection gate pattern and the string selection gate pattern, and the active region.

Channel regions 128 are defined on the substrate between the conductive active regions 126. The channel regions 128 are curved along the shape of the active region. The recessed region 112 is formed deeper than the junction depth of the conductive diffusion layer, so that the channel regions 128 may have a lower curved structure than the conductive diffusion layer 126, Accordingly, it is possible to maintain or increase the channel length of the selection transistor by increasing the recess depth irrespective of scaling down the width of the selection gate pattern.

Figure 7B:
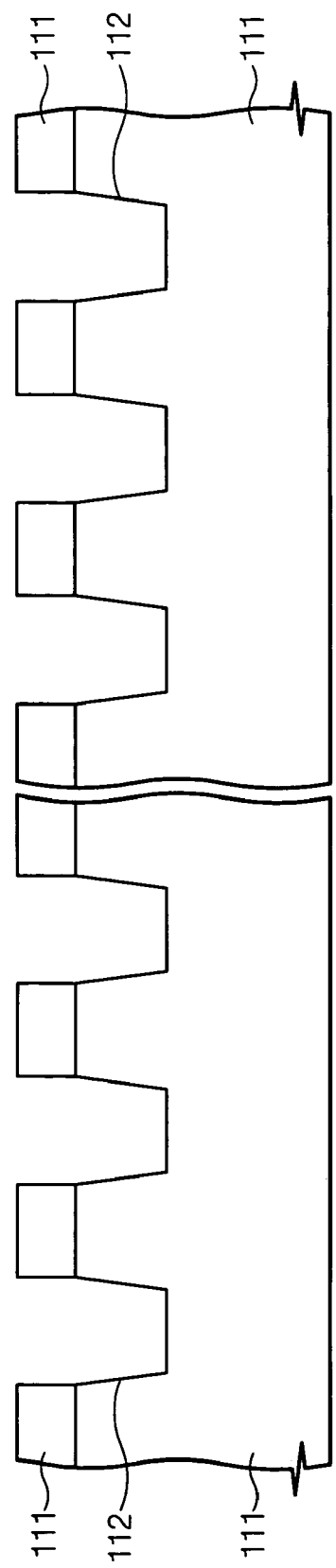
FIGS. 7B through 7E are cross-section views that illustrate methods of fabricating a NAND-type flash memory device according to the embodiments of the invention described illustrated in FIG. 5A.

FIGS. 7B through 7E are cross-section views that illustrate methods of fabricating a NAND-type flash memory device according to the embodiments of the invention described above with respect to FIG. 5A. Referring to FIG. 7B, a device isolation layer is formed on a semiconductor substrate to define a plurality of parallel active regions shown in FIG. 4. A hard mask layer is formed and patterned on an entire surface of the substrate to form a hard mask pattern 11 having an opening that exposes part of the substrate. The opening is formed so as to correspond to a position where a memory gate pattern and a selection gate pattern will be formed and cross over the active region. The substrate of the active region is etched using the hard mask pattern 111 as an etching mask to form a plurality of recess regions 112.

Figure 7C:
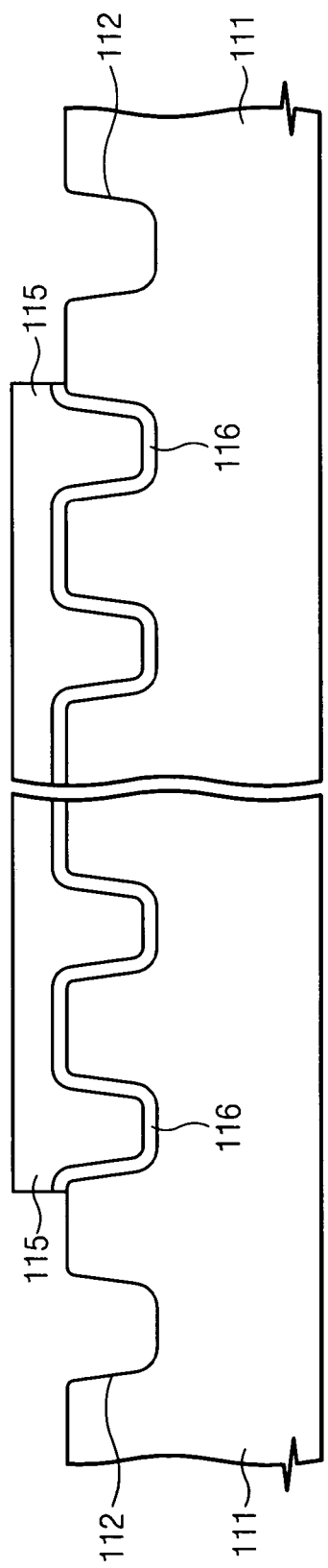

Referring to FIG. 7C, after removing the hard mask pattern 111, a charge storage insulating layer comprised of a sequential stacked structure of a tunnel insulating layer, a charge trap layer, and a blocking insulating layer is formed on an entire surface of the substrate. Before/after the charge storage insulating layer is formed, an impurity implantation process for controlling a threshold voltage is performed. The edge of the recess region 112 may be rounded by sacrificial oxidation and cleaning processes.

The charge storage layer 116 may comprise a silicon oxide layer, a silicon nitride layer and a stacked layer of a silicon oxide layer, or a silicon oxide layer, a silicon nitride layer and a stacked layer of an aluminum oxide layer, or a silicon oxide layer, a hafnium layer, a silicon nitride layer and a stacked layer of an aluminum oxide layer in accordance with various embodiments of the present invention. A mask pattern 115 for covering an upper portion of a region where a memory transistor is formed is formed on the substrate where the charge storage insulating layer 116 is formed. The mask pattern 115 covers an upper portion where a memory transistor is formed in a cell string and exposes a region where a selection gate is formed. The charge storage insulating layer 116 is removed using the mask pattern 115 as an etching mask. The charge storage insulating layer 116 on the recess region 112 and the active region neighboring the recess region is removed to expose the substrate.

Figure 7D:
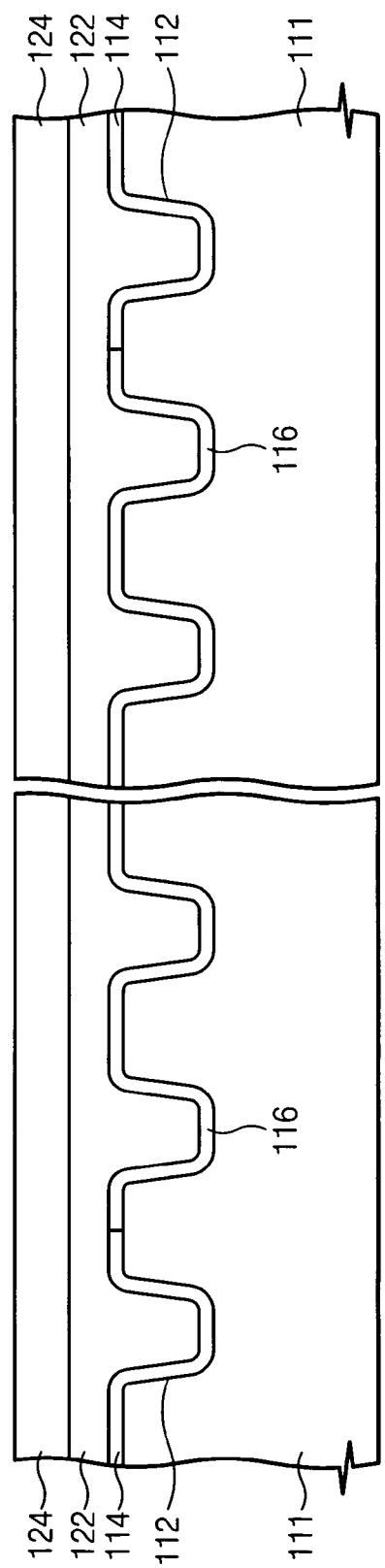

Referring to FIG. 7D, after removing the mask pattern 115, a gate insulating layer 114 is formed. In forming the gate insulating layer 114, an insulating layer may be formed on the upper most layer of the charge storage insulating layer 116. A lower conductive layer 122 and the upper conductive layer 124 are formed on an entire surface of the substrate. An insulating layer as a capping layer may be further formed on the upper conductive layer.

Figure 7E:
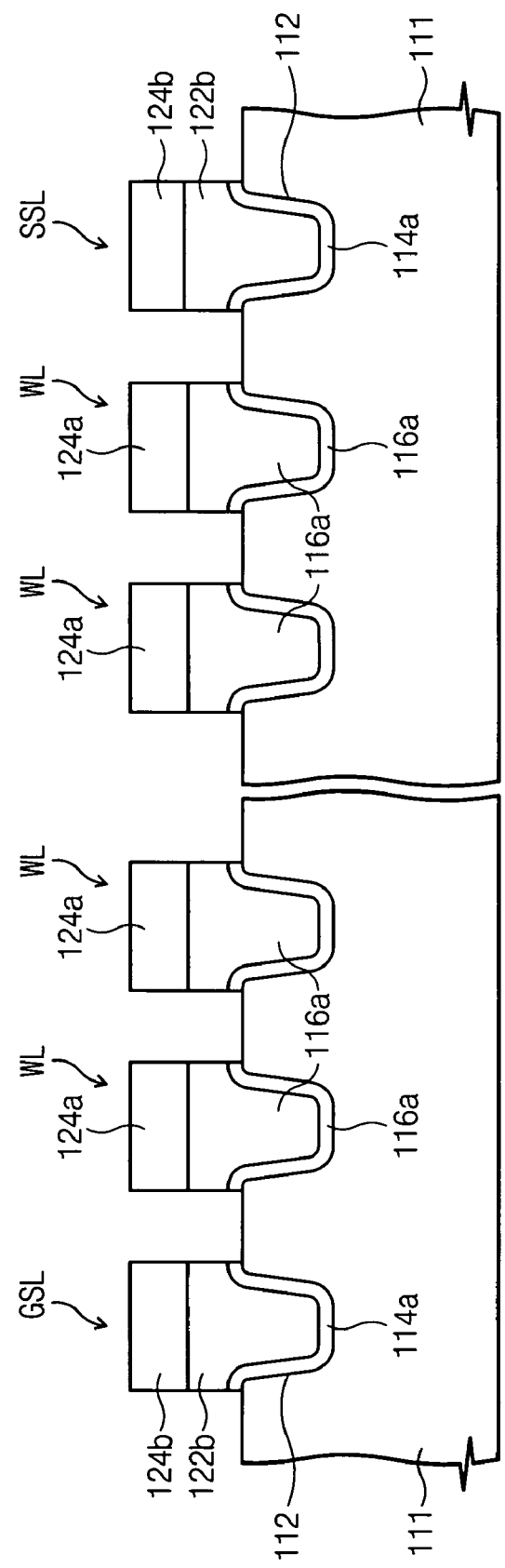

Referring to FIG. 7E, the upper conductive layer 124 and the lower conductive layer 122 are patterned to form a ground selection gate pattern and a string selection gate pattern crossing over the active regions, and a plurality of memory gate patterns arranged between the ground selection gate pattern and the string selection gate pattern. The ground selection gate pattern and the string selection gate pattern are arranged on an upper portion of the recess region 112, respectively, and are extended towards a lower portion of the substrate so as to have a curved lower portion. The charge storage insulating layer and a gate insulating layer at both sides of the ground selection gate pattern, the string selection gate pattern, and the memory gate patterns are removed to form a charge storage pattern 116a and a gate insulating pattern 114a.

Impurities are implanted using the memory gate patterns, the ground selection gate pattern, and the string selection gate pattern as an ion implantation mask to form a conductive diffusion layer 126. The junction of the conductive diffusion layer 126 may be located above the lower most portion of the recess region 112. As a result, a channel region 128 is defined on the substrate under the memory gate pattern and the selection gate pattern. The channel region 128 is curved along a surface curve of the recess region so as to be recessed lower than the junction depth of the neighboring conductive diffusion layer. The recess region 112 may be formed deeper than the width of the recess region to increase a channel length of a transistor in a limited area. Thus, embodiments of the present invention may be applicable to a floating-gate-type flash memory device having a floating gate.

Figure 8A:
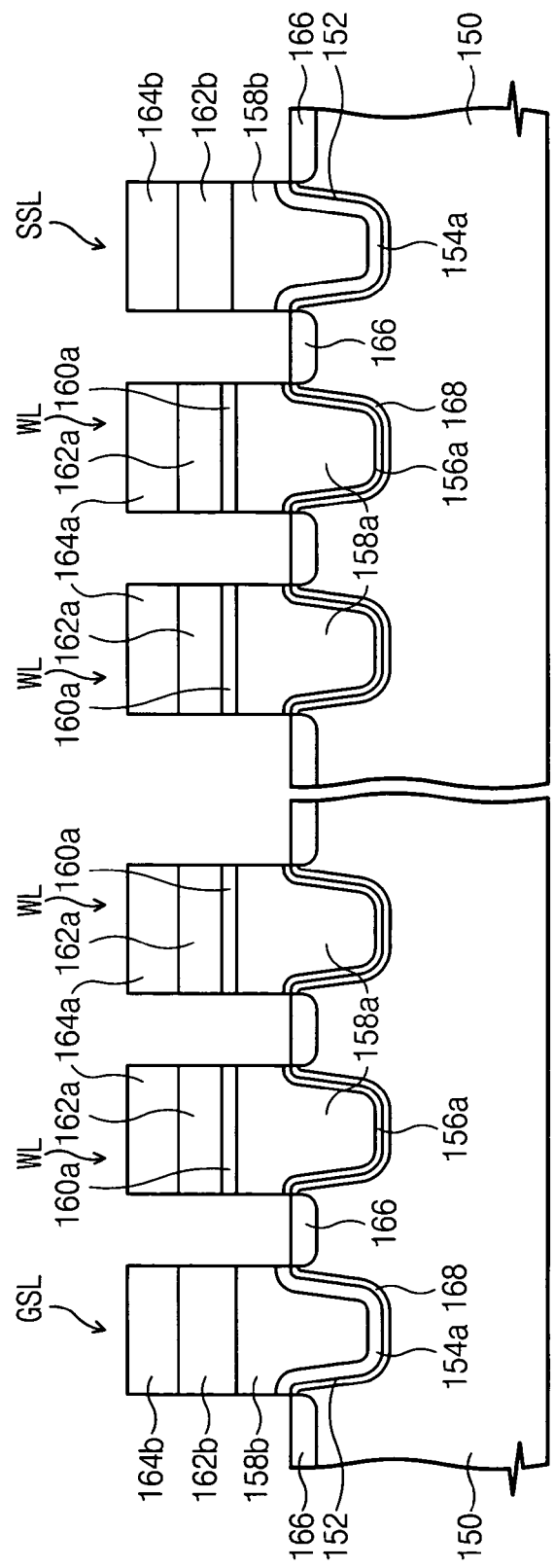
FIG. 8A is a cross-sectional view of a NAND-type flash memory device according to further embodiments of the present invention taken along line I-I' of FIG. 4.

FIG. 8A is a cross-sectional view of a NAND-type flash memory device according to further embodiments of the present invention taken along line I-I' of FIG. 4. Referring to FIG. 8A, a ground selection gate pattern and a string selection gate pattern are formed that cross over a plurality of active regions defined by a device isolation layer to be comprised of a ground selection line GSL and a string selection line SSL. Memory gate patterns comprising word lines WL are arranged in parallel with each other between the ground selection gate pattern and the string selection gate pattern.

A conductive diffusion layer 166 implanted with impurities is formed in the ground selection gate pattern, the string selection gate pattern, and active regions at both sides of the memory gate patterns. The memory gate patterns comprise a middle gate pattern 162a and an upper gate pattern 166a, respectively. In addition, the ground selection gate pattern and the string selection gate pattern are comprised of a sequential stacked structure of a lower gate pattern 158b, a middle gate pattern 162b, and an upper gate pattern 164b. The lower gate pattern 158b and the middle gate patterns 162a and 162b are generally formed of a silicon layer, and the upper gate patterns 164a and 164b comprise a high conductive layer such as metal, metal suicide, and the like. The upper most layer of the upper gate pattern may be comprise an insulation layer, such as a silicon oxide layer, a silicon nitride layer, and/or a silicon acid nitride layer.

A floating gate pattern 158a is disposed between the memory gate pattern and the active region. A gate interlayer dielectric layer 160a is disposed between the floating gate 158a and the memory gate pattern. A tunnel insulating layer is disposed between the floating gate 158a and the active region. A gate insulating layer 154a may be disposed between the ground selection gate pattern and the string selection gate pattern, and the active region. The active region under the memory gate pattern and the selection gate pattern is recessed. Accordingly, the lower portions of the memory gate pattern and the selection gate pattern are curved along the shape of the substrate.

Channel regions 168 are defined on the substrate between the conductive active regions 166. The recessed region 152 is formed deeper than the junction depth of the conductive layer 166 so that the channel region 168 under the ground selection gate pattern and the string selection gate pattern may be curved lower than the conductive diffusion layer 166. Therefore, it is possible to maintain or increase the channel length of the selection transistor by increasing the recess depth irrespective of scaling down the width of the selection gate pattern.

Figure 8B:
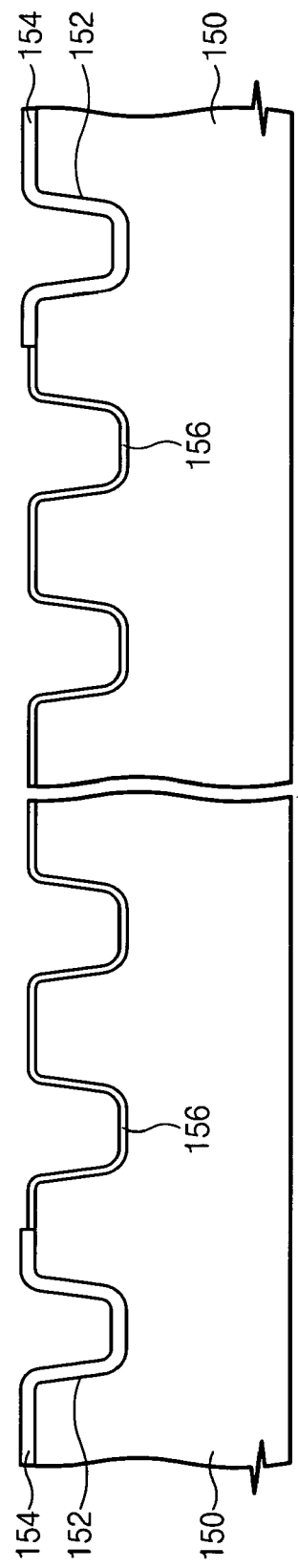
Figure 8C:
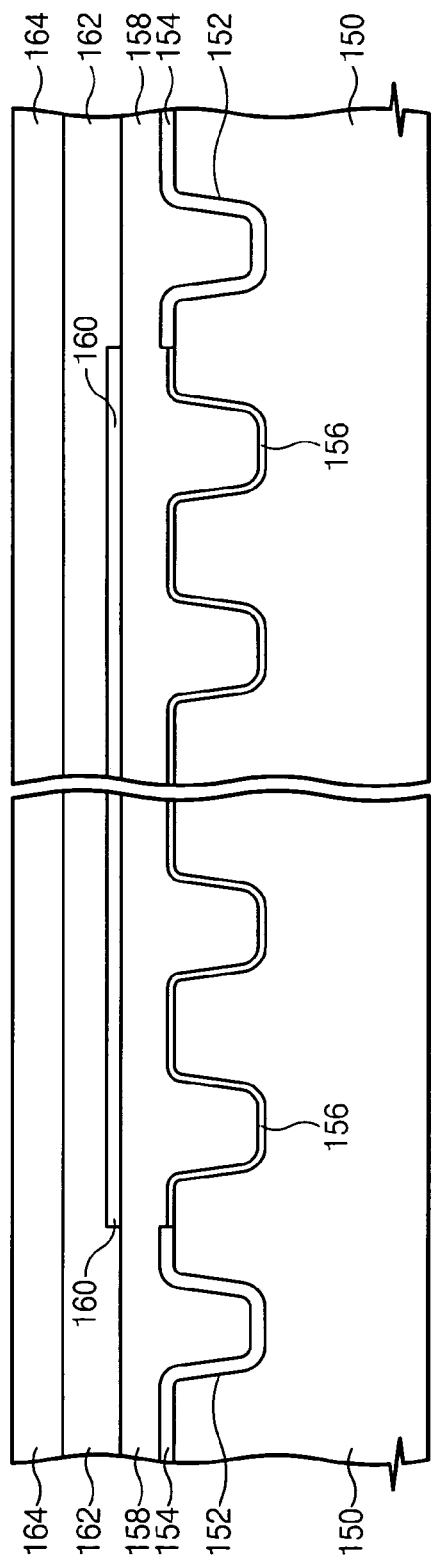

FIGS. 8B through 8D are cross-section views that illustrate methods of fabricating the NAND-type flash memory device according to the embodiments of the present invention described above with respect to FIG. 8A. Referring to FIG. 8D, a device isolation layer is formed on a semiconductor substrate to define a plurality of parallel active regions shown in FIG. 4. A hard mask pattern having an opening for exposing a part of the substrate is formed. The substrate is etched using the hard mask pattern as an etching mask to form a plurality of recess regions 152 on the active region. After removing the hard mask pattern, a gate insulating layer 154 is formed on an entire surface of the substrate. Before forming the gate insulating layer 154, sacrificial oxidation and cleaning processes may be performed. As a result, the edge of the recess regions 152 may be rounded. Before/after forming the gate insulating layer, an impurity implantation process for controlling a threshold voltage is preformed. The gate insulating layer 154 is removed by covering a region where a selection gate pattern is formed and exposing regions where memory gate patterns are formed. A tunnel insulating layer 154 is formed in a region where the gate insulating layer 154 is removed. As a result, as shown in FIG. 6, a tunnel insulating layer 156 is formed in a region where memory gate patterns are formed, and a region where a gate insulating layer is formed may be obtained on the active region at both sides of the tunnel insulating layer 156.

Referring to FIG. 8C, a lower conductive layer 158 is formed on an entire surface of the substrate. A gate interlayer dielectric layer 160 is formed on the lower conductive layer. The gate interlayer dielectric layer 160 is patterned to remove the gate interlayer dielectric layer over the recess region 152. A middle conductive layer 162 and an upper conductive layer 164 are formed. An insulating layer as a capping layer may be further formed on the upper conductive layer 164.

Referring to FIG. 8D, the upper conductive layer 164, the middle conductive layer 162, the gate interlayer dielectric layer 160, and the lower conductive layer 158 are patterned to form a ground selection gate pattern and a string selection gate pattern crossing over the active regions, and a plurality of memory gate patterns located between the ground selection gate pattern and the string selection gate pattern. The memory gate patterns, the ground selection gate pattern and the string selection gate pattern are respectively placed over the recess region 152 and are extended towards a lower portion of the substrate so as to have a curved lower portion. A tunnel insulating layer and a gate insulating layer at both sides of the ground selection gate pattern, the string selection gate pattern, and the memory gate patterns are removed to form a tunnel insulating pattern 156a and a gate insulating pattern 154a.

Impurities are implanted into the substrate using the memory gate patterns, the ground selection gate pattern, and the string selection gate pattern as an ion implantation mask to form the conductive diffusion layer 66 shown in FIG. 8A. The junction of the conductive diffusion layer 66 may be above the lower most surface of the recess region 152. As a result, channel regions 168 are defined on the substrate under the memory gate pattern and the selection gate pattern, that is, the substrate between the conductive diffusion layers 166. The channel region 168 under the selection gate pattern bends along a surface curve of the recess region 166 so as to have a structure that is recessed lower than the junction depth of the neighboring conductive diffusion layer. The recess region may be formed deeper than the width of the recess region 166 to increase the channel length of the transistor in a limited area.

As discussed above, it is possible to maintain or increase the channel length irrespective of scaling down the width of a gate pattern due to shrinkage of a transistor by forming a selection transistor having a recess channel in a non-volatile memory device including a selection transistor. Accordingly, because punch-through by a structure of a short-channel transistor can be reduced or prevented, it is possible to suppress leakage current through a selection transistor. As a result, a channel voltage of a non-selection cell string is not boosted in a program operation so that an abnormal program operation can be prevented.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A NAND-type flash memory device, comprising:
an active region defined by a device isolation layer on a substrate, the active region having a pair of recessed regions spaced apart from each other;
a ground selection transistor and a string selection transistor on the active region, each of the ground selection transistor and the string selection transistor having a recessed channel along each of the recessed regions; and
a plurality of memory transistors on the active region between the ground selection transistor and the string selection transistor;
wherein each of the ground selection transistor and the string selection transistor has a source and a drain, and
wherein each of the recessed regions is disposed between the source and the drain, and has a depth that is greater than a distance between the source and the drain.

2. The NAND-type flash memory device of claim 1, wherein each one of the plurality of memory transistors comprises a tunnel insulating layer, a floating gate, a gate interlayer insulating layer, and a control gate electrode, which are sequentially stacked on the active region.

3. The NAND-type flash memory device of claim 1, wherein each one of the plurality of memory transistors comprises a charge storage insulating layer and a gate electrode, which are stacked on the active region.

4. The NAND-type flash memory device of claim 1, wherein the respective recessed channels of the ground and string selection transistors are more deeply recessed than a junction depth of the source and the drain.

5. A NAND-type flash memory device, comprising:
an active region defined by a device isolation layer on a substrate, the active region having a plurality of recessed regions spaced apart from each other;
a ground selection transistor and a string selection transistor on the active region; and
a plurality of memory transistors on the active region between the ground selection transistor and the string selection transistors,
wherein each of the plurality of memory transistors, and the ground and the string selection transistors has a recessed channel along each of the recessed regions,
wherein each of the memory transistors, and the ground and the string selection transistors has a source and a drain, and
wherein each of the recessed regions of the plurality of memory transistors, and the ground and the string selection transistors is disposed between the source and the drain, and has a depth that is greater than a distance between the source and the drain.

6. The NAND-type flash memory device of claim 5, wherein the respective recessed channels of the plurality of memory transistors are more deeply recessed than a junction depth of the source and the drain.

7. A flash memory device, comprising:
a substrate;
a device isolation layer disposed on the substrate to define a plurality of parallel active regions;
ground and string selection gate patterns that cross over the active regions;
a plurality of memory gate patterns disposed between the ground and string selection gate patterns that cross over the active regions;
a plurality of charge storage layers disposed between the plurality memory gate patterns and the active regions, respectively; and conductive diffusion layers disposed on the substrate at both sides of the ground and the string selection gate patterns and the plurality of memory gate patterns to define respective channel regions under the ground and the string selection gate patterns and the plurality of memory gate patterns;

wherein the respective channel regions under the ground and the string selection gate patterns are more deeply recessed than a junction depth of the conductive diffusion layers;

wherein each of the respective channels regions has a recess depth that is greater than a distance between the conductive diffusion layers.

8. A flash memory device, comprising:

a substrate;

a device isolation layer disposed on the substrate to define a plurality of parallel active regions;

ground and string selection gate patterns that cross over the active regions;

a plurality of memory gate patterns disposed between the ground and string selection gate patterns that cross over the active regions;

a plurality of charge storage layers disposed between the plurality memory gate patterns and the active regions, respectively; and conductive diffusion layers disposed on the substrate at both sides of the ground and string selection gate patterns and the plurality of memory gate patterns to define respective channel regions under the ground and string selection gate patterns and the plurality of memory gate patterns;

wherein the respective channel regions under the ground and string selection gate patterns are more deeply recessed than a junction depth of the conductive diffusion layers;

wherein the respective channel regions under the plurality of memory gate patterns are more deeply recessed than the junction depth of the conductive diffusion layers, wherein each of the respective channel regions has a recess depth that is greater than a distance between the conductive diffusion layers.

9. A flash memory device comprising:

a substrate;

a device isolation layer disposed on the substrate to define a plurality of parallel active regions;

ground and string selection gate patterns that cross over the active regions;

a plurality of memory gate patterns disposed between the ground and string selection gate patterns that cross over the active regions;

a plurality of floating gates disposed between the plurality of memory gate patterns and the active regions, respectively; and conductive diffusion layers disposed on the substrate at both sidewalls of the ground and string selection gate patterns and the plurality of memory gate patterns to define respective channel regions under the ground and string selection gate patterns and the memory gate patterns;

wherein the respective channel regions under the ground and string selection gate patterns are more deeply recessed than a junction depth of the conductive diffusion layers;

wherein each of the respective channels regions has a recess depth that is greater than a distance between the conductive diffusion layers.

10. The flash memory device of claim 9, wherein the respective channel regions under the plurality of memory gate patterns are more deeply recessed than the junction depth of the conductive diffusion layers.

* * * * *